US008090113B2

(12) United States Patent
Chuang et al.

(10) Patent No.: US 8,090,113 B2
(45) Date of Patent: Jan. 3, 2012

(54) SYSTEM AND METHOD FOR MODULATING AUDIO EFFECTS OF SPEAKERS IN A SOUND SYSTEM

(75) Inventors: Ping-Yang Chuang, Taipei Hsien (TW); Yi-Ching Weng, Taipei Hsien (TW); Chun-Hsien Wu, Taipei Hsien (TW); Hai-Feng Zhang, Shenzhen (CN); Hai-Tao Liu, Shenzhen (CN); Qing-Bo Yuan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 795 days.

(21) Appl. No.: 12/195,423

(22) Filed: Aug. 21, 2008

(65) Prior Publication Data

US 2009/0136051 A1 May 28, 2009

(30) Foreign Application Priority Data

Nov. 26, 2007 (CN) .......................... 2007 1 0202661

(51) Int. Cl.
*H03G 3/00* (2006.01)

(52) U.S. Cl. ............................. 381/61; 381/58; 381/303

(58) Field of Classification Search .................... 381/61, 381/58, 303

See application file for complete search history.

(56) References Cited

U.S. PATENT DOCUMENTS

| | | | | |
|---|---|---|---|---|
| 3,178,502 | A * | 4/1965 | Clark, Jr. | 84/705 |
| 5,988,645 | A * | 11/1999 | Downing | 273/348 |
| 5,991,693 | A * | 11/1999 | Zalewski | 701/300 |
| 6,169,240 | B1 * | 1/2001 | Suzuki | 84/605 |
| 7,333,622 | B2 * | 2/2008 | Algazi et al. | 381/310 |
| 7,373,210 | B2 * | 5/2008 | Pennock et al. | 700/94 |
| 7,415,078 | B2 * | 8/2008 | Smit | 375/330 |
| 7,522,736 | B2 * | 4/2009 | Adcock et al. | 381/92 |
| 7,587,053 | B1 * | 9/2009 | Pereira | 381/77 |
| 8,037,414 | B2 * | 10/2011 | Michaelis et al. | 715/729 |
| 2003/0007648 | A1 * | 1/2003 | Currell | 381/61 |
| 2004/0136549 | A1 * | 7/2004 | Pennock et al. | 381/119 |
| 2005/0249360 | A1 * | 11/2005 | Adcock et al. | 381/92 |
| 2008/0170729 | A1 * | 7/2008 | Lissaman et al. | 381/303 |
| 2009/0136051 | A1 * | 5/2009 | Chuang et al. | 381/61 |
| 2010/0150359 | A1 * | 6/2010 | KnicKrehm et al. | 381/58 |
| 2011/0091055 | A1 * | 4/2011 | LeBlanc | 381/303 |

* cited by examiner

*Primary Examiner* — Laura Menz
(74) *Attorney, Agent, or Firm* — Altis Law Group, Inc.

(57) ABSTRACT

A system for modulating audio effects of speakers is provided. The system includes a selecting module, a playing module, a recording module, a time delay computing module and a modulating module. Based on these modules, the system is capable of determining a time difference and a pitch for each of the speakers, and modulating the time difference and the pitch for each of the speakers to a desired time difference and a desired pitch, so as to ensure that simultaneous sounds from each speaker arrive at a microphone at about the same time and with the same audio pitch. A related method is also provided.

6 Claims, 2 Drawing Sheets

SYSTEM AND METHOD FOR MODULATING AUDIO EFFECTS OF SPEAKERS IN A SOUND SYSTEM

BACKGROUND

1. Field of the Invention

Embodiments of the present disclosure relate to audio signal analyzing systems and methods, and particularly to a system and method for modulating audio effects of speakers in a sound system.

2. Description of Related Art

In any sound system, ultimate sound quality depends on how the quality of the speakers in the sound system. A speaker is a component that takes an audio signal stored on storage like compact disks (CDs), tapes and digital video disks (DVDs), and turns the audio signal back into sound waves that people can hear. Generally, a sound system has more than one speaker, and sound systems that provide better surround-sound effect generally has more that one speaker. For example, the type of 2.1 channel surround sound system has a left channel speaker, a right channel speaker and a super-undertone speaker, and the type of 5.1 channel surround sound system has a front-left channel speaker, a front-right channel speaker, a rear-left channel speaker, a rear-right channel speaker, and a super-undertone speaker.

For a surround sound system with good quality, in one aspect, sounds from different speakers should reach a listener's ears at about the same instant. In another aspect, sounds from different speakers should have about the same pitch. However, it's difficult to ensure that speakers in the surround sound system have the above characteristics once they are produced.

What is needed, therefore, is a system and method for modulating audio effects of speakers in a sound system.

SUMMARY

A system for modulating audio effects of speakers is provided. The system comprises a selecting module, a playing module, a recording module, a time difference computing module and a modulating module. The selecting module is configured for selecting a speaker from the speakers, and powering the selected speaker on. The playing module is configured for playing an original audio file stored in a storage device to generate an audio signal, and further configured for outputting the audio signal via the selected speaker. The recording module is configured for recording the audio signal as a new audio file via a microphone, and further configured for recording a playing start time and a recording start time. The time difference computing module is configured for computing a time difference between the playing start time and the recording start time. The pitch obtaining module is configured for obtaining a pitch from the new audio file. The modulating module is configured for modulating the time difference and the pitch to a desired time difference and a desired pitch for each of the speakers.

Other objects, advantages and novel features will become more apparent from the following detailed description of certain embodiments of the present disclosure when taken in conjunction with the accompanying drawings, in which:

DETAILED DESCRIPTION OF CERTAIN INVENTIVE EMBODIMENTS

Figure 1:
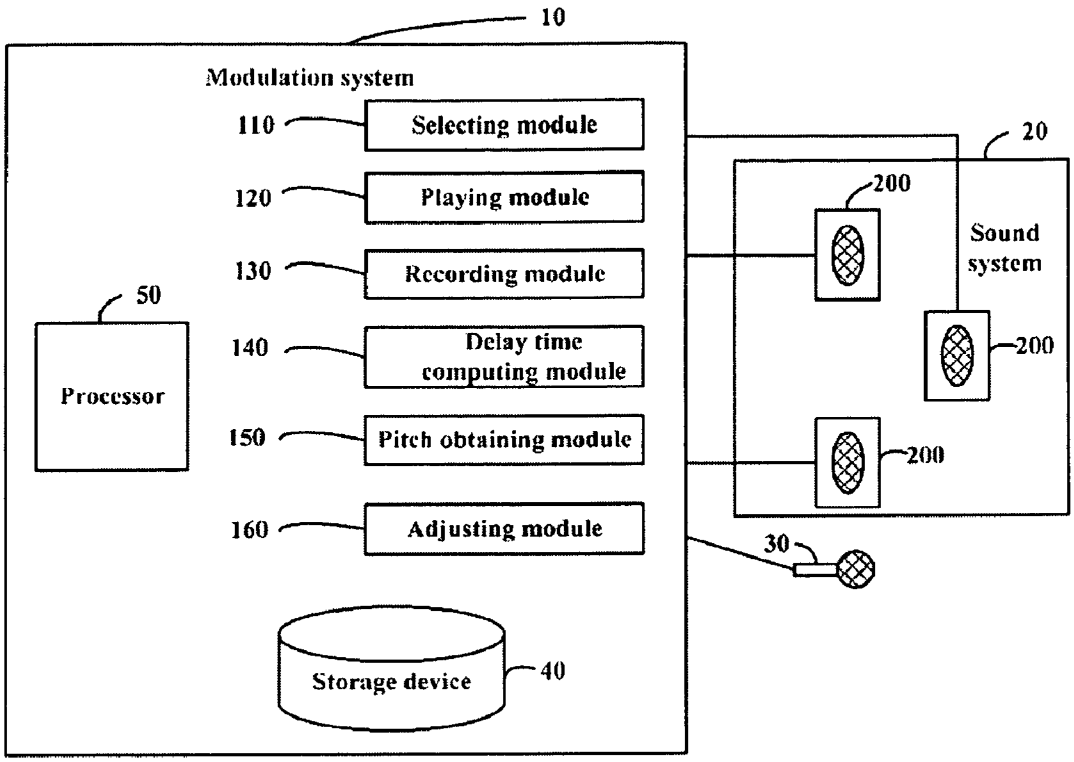
FIG. 1 is a block diagram of one embodiment of a system for modulating audio effect of speakers in a sound system.

FIG. 1 is a block diagram of one embodiment of a modulation system 10 for modulating audio effects of speakers in a sound system 20. As used herein, the term, "audio effects of speakers" is defined include different speakers emitting a substantially same pitch at substantially the same point in time to a listener's ears. The modulation system 10 is connected with the sound system 20, which includes a plurality of speakers 200 for playing audio files. Moreover, the modulation system 10 is connected with a microphone 30 and a storage device 40. The microphone 30 is configured for recording an audio file played by one of the speakers 200 as a new audio file. The storage device 40 is configured for storing the audio files, including the audio file and the new audio file. Depending on the embodiment, the modulation system 10, may comprise the storage device 40 and in other embodiments, the modulation system 10 may connect to a network to electronically access the storage device 40 over the network.

In one embodiment, the modulation system 10 may comprise software modules configured for modulating audio effect of speakers in the audio system 20. In one embodiment, the modulation system 10 includes a selecting module 110, a playing module 120, a recording module 130, a time difference computing module 140, a pitch obtaining module 150, and a modulating module 160. One or more general purpose or specialized processors, such as a processor 50 may execute the selecting module 110, the playing module 120, the recording module 130, the time difference computing module 140, the pitch obtaining module 150, and the modulating module 160.

The selecting module 110 is configured for selecting a speaker 200 from the plurality of speakers 200, and turning on the selected speaker 200.

The playing module 120 is configured for playing an original audio file stored in the storage device 40 to generate an audio signal, and further configured for outputting the audio signal via the speaker 200. In one embodiment, the original audio file is in a WAVE format. In other embodiments, the original audio file may be an MIDI format or be any other playable format.

The recording module 130 is configured for recording the audio signal outputted by the speaker 200 as a new audio file via the microphone 30. The recording module 130 is further configured for tracking a time that the playing module 120 starts to play the original audio file (hereinafter referred to as "the playing start time") and tracking a time the recording module 130 starts to record the audio signal (hereinafter referred to as "the recording start time"). In one embodiment, the new audio file is also in a WAVE format. In other embodiments, the new audio file may be an MIDI format, or an MPI format. The recording module 130 may store the new audio file into storage device 40. The storage device 40, in one embodiment, may comprise a hard disk drive, a flash drive, a CD drive, for example.

The time difference computing module 140 is configured for computing a time difference between the playing start time and the recording start time for each speaker 200.

The pitch obtaining module 150 is configured for determining a pitch of the new audio file. For example, the pitch obtaining module 150 may transform the new audio file, in the WAVE format, from the time domain to the frequency domain, then obtains the pitch of the new audio file from the frequency domain. It is understood that a pitch of a sound (or an audio file) is commonly referred to a frequency of the sound (or the audio file). A high pitch sound corresponds to a high frequency sound wave and a low pitch sound corresponds to a low frequency sound wave.

The modulating module 160 is configured for modulating the time difference and the pitch for each of the speakers 200 to a desired time difference and a desired pitch. In one particular example, to play the same audio file, the time difference of a first speaker 200 may be 3 ms, the time difference of a second speaker 200 may be 2 ms, and the time difference of a third speaker 200 may be 4 ms. Then, the modulating module 160 may modulate the time difference of the first speaker 200 and the third speaker 200 to be 2 ms. Moreover, pitches of the same audio file may be different when playing the same audio file by different speakers 200, for example, a pitch of a first new audio file corresponding to the first speaker 200 may be 100 KHz, a pitch of a second new audio file corresponding to the second speaker 200 may be 101 KHz, and a pitch of a third new audio file corresponding to the third speaker 200 may be 102 KHz. Then, the modulating module 160 may modulates the first, second and third speakers 200 to play the same audio file with the same pitch, e.g., 100 KHz.

Figure 2:
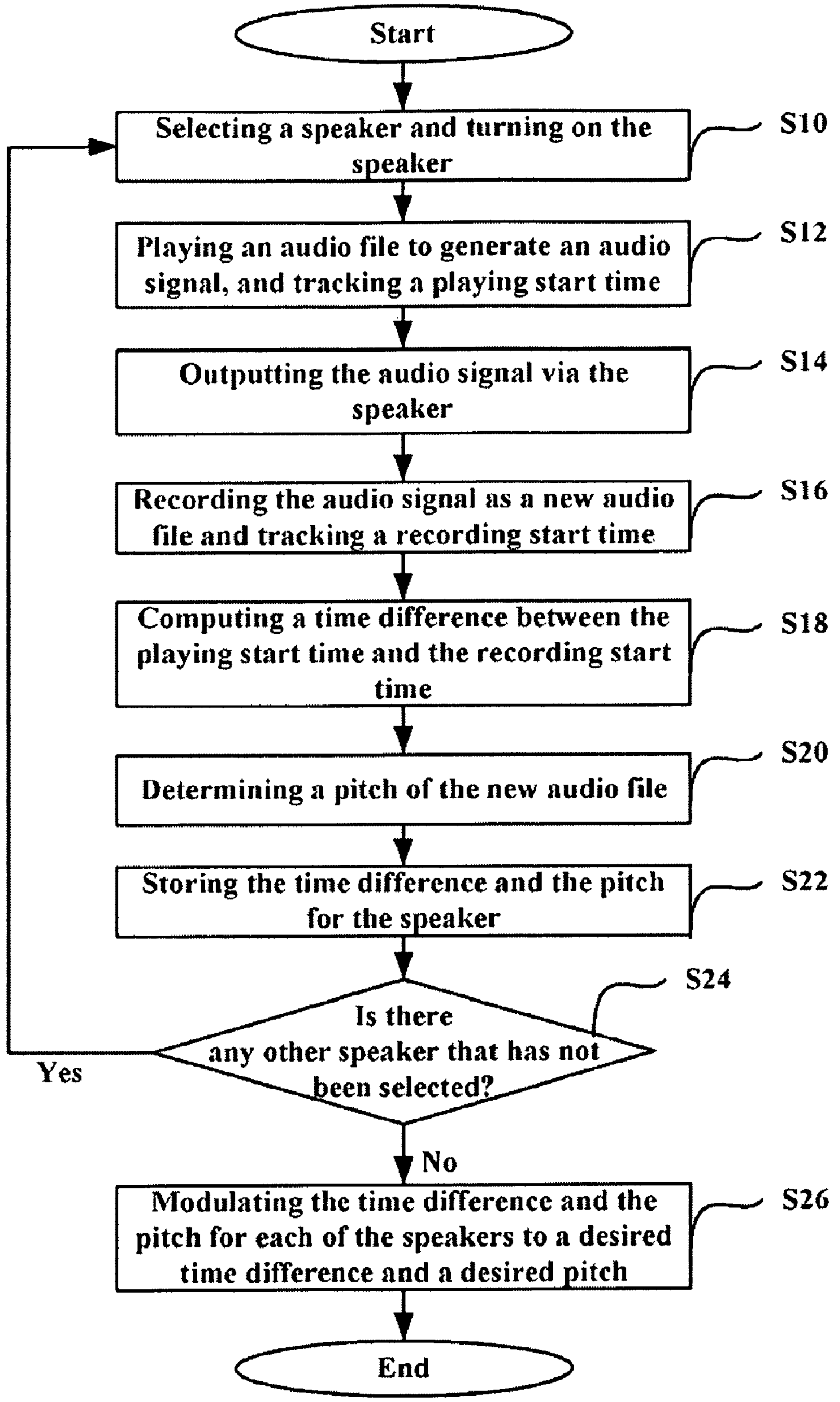
FIG. 2 is flowchart of one embodiment of a method for modulating audio effects of speakers in the sound system.

FIG. 2 is a flowchart of one embodiment of a method for modulating audio effect of speakers in the sound system 20. Depending on the embodiment, additional blocks may be added, others removed, and the ordering of the blocks may be changed.

In block S10, the selecting module 110 selects the speaker 200, and turns on the speaker 200. In block S12, the playing module 120 plays an original audio file stored in the storage device 40 to generate an audio signal. Then, the recording module 130 tracks a playing start time, such as T=t1. In block S14, the selected speaker 200 outputs the audio signal. In block S16, the recording module 130 records the audio signal as a new audio file via the microphone 30, the recording module 130 also tracks a recording start time, such as T=t2, and stores the new audio file into the storage device 40.

In block S18, the time delay computing module 140 determines a time difference between the playing start time and the recording start time, i.e., T=t2−t1.

In block S20, the pitch determining module 150 determines a pitch of the new audio file. In block S22, the recording module 130 stores the time difference and the pitch of the new audio file for the speaker 200 into the storage device 40. In block S24, the selecting module 110 determines if there are any other speakers 200 that has not been selected. If there are any other speakers 200 that has not been selected, the procedure repeats from the block S10 until time differences and pitches for all the speakers 200 have been determined. Then, the procedure goes to block S26, the modulating module 160 modulates the time difference and the pitch for each of the speakers to a desired time difference and a desired pitch, so as to ensure that sounds outputted from each of the plurality of speakers travels to the microphone almost simultaneously and with a same pitch.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-based method for modulating audio effects of speakers in a sound system, the method comprising:

selecting a speaker from the speakers, and turning on the selected speaker;

playing an audio file stored in a storage device to generate an audio signal, and tracking a playing start time of the audio file;

outputting the audio signal via the selected speaker;

recording and storing the audio signal as a new audio file via a microphone, and tracking a recording start time;

determining a time difference between the playing start time and the recording start time;

determining a pitch of the new audio file;

repeating from the selecting step to the computing step, until all time differences and pitches for all of the speakers have been determined; and modulating the time difference and the pitch for each of the speakers to a desired time difference and a desired audio pitch.

2. The method as claimed in claim 1, further comprising: storing the new audio file into the storage device.

3. The method as claimed in claim 1, further comprising: storing the time difference and pitch for each of the speakers into the storage device.

4. A computer-readable medium having stored thereon instructions that, when executed by a computer, causing the computer to perform a method for modulating audio effects of speakers in a sound system, the method comprising:

selecting a speaker from the speakers, and turning on the selected speaker;

playing an original audio file stored in a storage device to generate an audio signal, and tracking a playing start time;

outputting the audio signal via the selected speaker;

recording and storing the audio signal as a new audio file via a microphone, and tracking a recording start time;

determining a time difference between the playing start time and the recording start time;

determining a pitch of the new audio file;

repeating from the selecting step to the computing step, until all time differences and pitches for all of the speakers have been determined; and modulating the time difference and the pitch for each of the speakers to a desired time difference and a desired audio pitch.

5. The medium as claimed in claim 4, wherein the method further comprising storing the new audio file into the storage device.

6. The medium as claimed in claim 4, wherein the method further comprising storing the time difference and pitch for each of the speakers into the storage device.

* * * * *